United States Patent
Noda

(10) Patent No.: US 6,717,532 B2
(45) Date of Patent: Apr. 6, 2004

(54) COMMUNICATION SYSTEM AND METHOD

(75) Inventor: Seiichi Noda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/287,717

(22) Filed: Nov. 5, 2002

(65) Prior Publication Data

US 2003/0091120 A1 May 15, 2003

(30) Foreign Application Priority Data

Nov. 6, 2001 (JP) ........................................ 2001-340787

(51) Int. Cl.[7] ........................... H03M 13/00; H03M 1/60
(52) U.S. Cl. .......................................... 341/57; 341/94
(58) Field of Search .............................. 341/57, 94, 58; 375/264

(56) References Cited

U.S. PATENT DOCUMENTS

| | | | | |
|---|---|---|---|---|
| 3,679,977 A | * | 7/1972 | Howson | 375/290 |
| 4,431,987 A | * | 2/1984 | Whiteside | 341/118 |
| 5,168,509 A | * | 12/1992 | Nakamura et al. | 375/286 |
| 5,633,892 A | * | 5/1997 | Krisher | 375/286 |
| 6,339,622 B1 | * | 1/2002 | Kim | 375/287 |

FOREIGN PATENT DOCUMENTS

| | | | | |
|---|---|---|---|---|
| JP | 402280534 A | * | 11/1990 | H03M/13/00 |
| JP | 4-196945 A | | 7/1992 | H04L/27/00 |
| JP | 2003-60724 A | | 2/2003 | |
| JP | 2003-134184 A | | 5/2003 | |

OTHER PUBLICATIONS

A.M. Michelson et al., "Error–Control Techniques for Digital Communication", Nonbinary BCH Codes and Reed–Solomon Codes, (1985), pp 170–185.

Y. Miyagawa et al., "Code Theory", Shokoodo Press, (1973), pp 628–637.

* cited by examiner

Primary Examiner—Peguy JeanPierre
(74) Attorney, Agent, or Firm—Sughrue Mion, PLLC

(57) ABSTRACT

A communication system comprises a transmitting apparatus and receiving apparatus for transmitting/receiving a N-ary signal, based on a prime number exceeding 2, inclusive of an efficient error correction system. The transmitting apparatus includes a binary to N-ary converting unit for converting a binary transmit signal into an N-ary signal, as an information sequence, where the N of the N-ary number is a prime number exceeding 2, an encoding unit for generating a transmit sequence, comprised of BCH code on a Galois field with the number of elements being a prime number exceeding 2, and a multi-level modulating unit for multi-level modulating the transmit sequence and for transmitting the multi-level modulated transmit sequence to a receiving apparatus. The receiving apparatus includes a demodulating unit for demodulating the received signal from the transmitting apparatus and for producing a multi-leveled received sequence, with the multi-level of the received sequence being a prime number exceeding 2, a decoding unit for decoding the received sequence by a decoding method for a BCH code on a Galois field with the number of elements being a prime number exceeding 2, and a N-ary to binary conversion unit for producing a decoded binary signal from the N-ary signal as a decoded sequence.

6 Claims, 12 Drawing Sheets

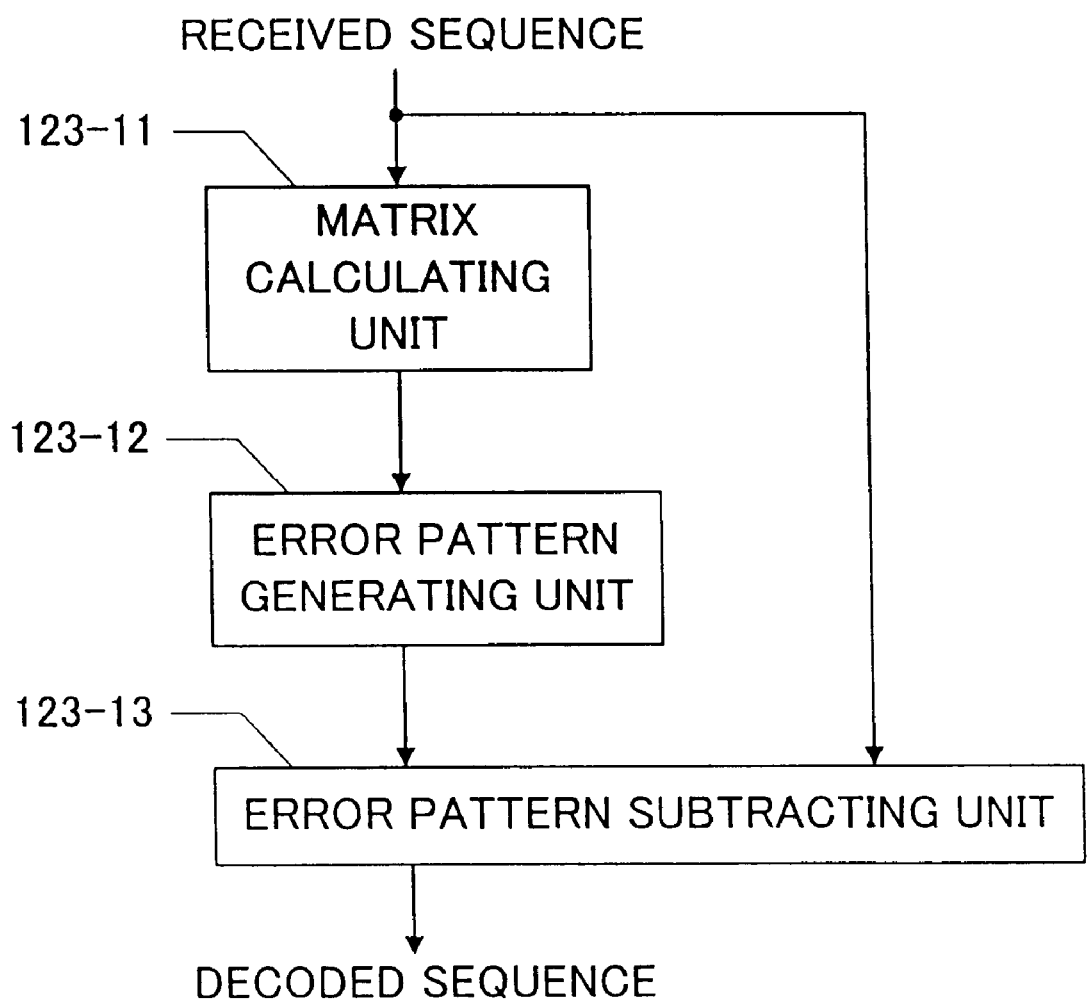

COMMUNICATION SYSTEM AND METHOD

FIELD OF THE INVENTION

This invention relates to a communication system and a communication method for transmitting/receiving signals over a transmission line. More particularly, it relates to a communication system and a communication method employing multi-level modulation system.

BACKGROUND OF THE INVENTION

The multi-level modulation system is used in particular in e.g., digital micro-wave communication. Heretofore, $2^n$QAM, such as 4QAM, 16QAM, 32QAM, 64QAM, 128QAM, 256QAM and so forth have been used in the multi-level modulation.

In the digital micro-wave communication, 4QAM, 16QAM, 32QAM, 64QAM, 128QAM, 256QAM and so forth have been used in general for circuit simplicity. However, with recent progress in the integrated circuit technology, implementation difficulties ascribable to circuit complexity are decreasing, while a demand for effective frequency utilization and effective transmission power utilization are becoming stronger.

For meeting with this demand, various methods for constructing the multi-level modulation system, in which the number of the multi-level is not necessarily $2^n$, have been proposed. Typical of these are "Multi-Level Modulation Demodulation Communication Method and System" as disclosed in the JP Patent Kokai Publication JP-A-04-196945, "Multi-Level Modulation Demodulation Device, Multi-Level Modulation Demodulation Communication System, Modulation Demodulation Program and Modulation Demodulation Method" as disclosed in the JP Patent Application No. 2001-246891, not laid open as of the filing time of the present application, and "Multi-Level Modulation Demodulation Device, Multi-Level Modulation Demodulation Communication System, Modulation Demodulation Program and Modulation Demodulation Method" as disclosed in the JP Patent Application No. 2001-246890, not laid open as of the filing time of the present application.

SUMMARY OF THE DISCLOSURE

The above proposals are directed to the methods for constructing the multi-level modulation but not to the application of the multi-leveled error correction system. In consideration of error occurrence on the transmission line, it is mandatory to encode an information sequence into a transmit sequence and to decode the received sequence added with errors produced on the transmission line to obtain a decoded sequence. An error correction system is therefore required which is in coping with the degradation of signal quality on the multi-level modulation system.

The block diagram of FIG. 12 shows a correction system conforming to the multi-level modulation system which is thought to be routine among those skilled in the art. Referring to FIG. 12, a transmitting apparatus 901 of the related art includes a binary error correction encoding circuit 902, a binary to N-ary conversion circuit 903 and a multi-level modulation unit 904, while a receiving apparatus 921 of the related art includes a multi-level demodulation unit 922, an N-ary to binary conversion circuit 923 and a binary error correction decoding circuit 923. Neither the transmitting apparatus 901 nor the receiving apparatus 921 uses the nonbinary error correction system, which is based on the nonbinary error correction code. In the transmitting apparatus 901, the binary error correction coding circuit, generating the error correction code based on the binary signal, is placed ahead of the binary to N-ary conversion circuit 903, whereas, in the receiving apparatus 921, the binary error correction decoding circuit, carrying out the error correction based on the binary signal, is placed at back of the binary error correction decoding circuit 923.

However, with the configuration of FIG. 12, no efficient error correction system, for coping with the multi-level transmission, can be implemented. That is, the configuration of FIG. 12 leads to redundancy for achieving the equivalent code length which is larger than in case the nonbinary code is used.

In view of the above-depicted status of the art, it is an object of the present invention to provide a communication system and a communication method which includes an efficient error correction system and which is designed to transmit/receive an N-ary signal in which N is a prime number exceeding 2.

The above and other objects are attained by a communication system in accordance with one aspect of the present invention, including a transmitting apparatus and a receiving apparatus for sending/receiving signals over a transmission line, wherein the transmitting apparatus comprises binary to N-ary converting means for converting a binary transmit signal into an N-ary signal, as an information sequence, the N-ary number being a prime number exceeding 2, encoding means for generating a transmit sequence which includes a nonbinary error correction code, based on the N-ary signal as the information sequence, and multi-level modulating means for modulating the transmit sequence to send the modulated transmit sequence to the receiving apparatus, and wherein the receiving apparatus comprises demodulating means for demodulating the received signal sent from the transmitting apparatus and for producing a multi-leveled received sequence, the multi-level being a prime number exceeding 2, decoding means for decoding the received sequence by a nonbinary error correction code decoding method to produce an N-ary signal, the N-ary number being a prime number exceeding 2, and N-ary to binary conversion means for producing a decoded binary signal from the N-ary signal as the decoded sequence.

In accordance with another aspect of the present invention, there is provided a transmitting apparatus for sending a signal over a transmission line to a receiving apparatus, comprising binary to N-ary converting means for converting a binary transmit signal into an N-ary signal, the N-ary number being a prime number exceeding 2, as a transmit sequence, encoding means for generating a transmit sequence which includes a nonbinary error correction code, based on the N-ary signal as the information sequence, and multi-level modulation means for multi-level modulating the transmit sequence to sending the modulated transmit sequence to the receiving apparatus.

In accordance with a further aspect the present invention, there is provided a receiving apparatus for receiving a signal from a transmitting apparatus over a transmission line, comprising demodulating mean for demodulating a receive signal from the transmitting apparatus to produce a multi-leveled sequence, the multi-level being a prime number exceeding 2, decoding means for decoding the received sequence by a nonbinary error correction code decoding method to produce an N-ary signal, the N-ary number being a prime number exceeding 2, and N-ary to binary converting means for producing a decoded binary signal from the N-ary signal as the decoded sequence.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 10 is a block diagram showing an illustrative structure of a nonbinary (ternary) error correction decoding circuit of FIG. 1 employing the present invention.

PREFERRED EMBODIMENTS OF THE INVENTION

Figure 1:
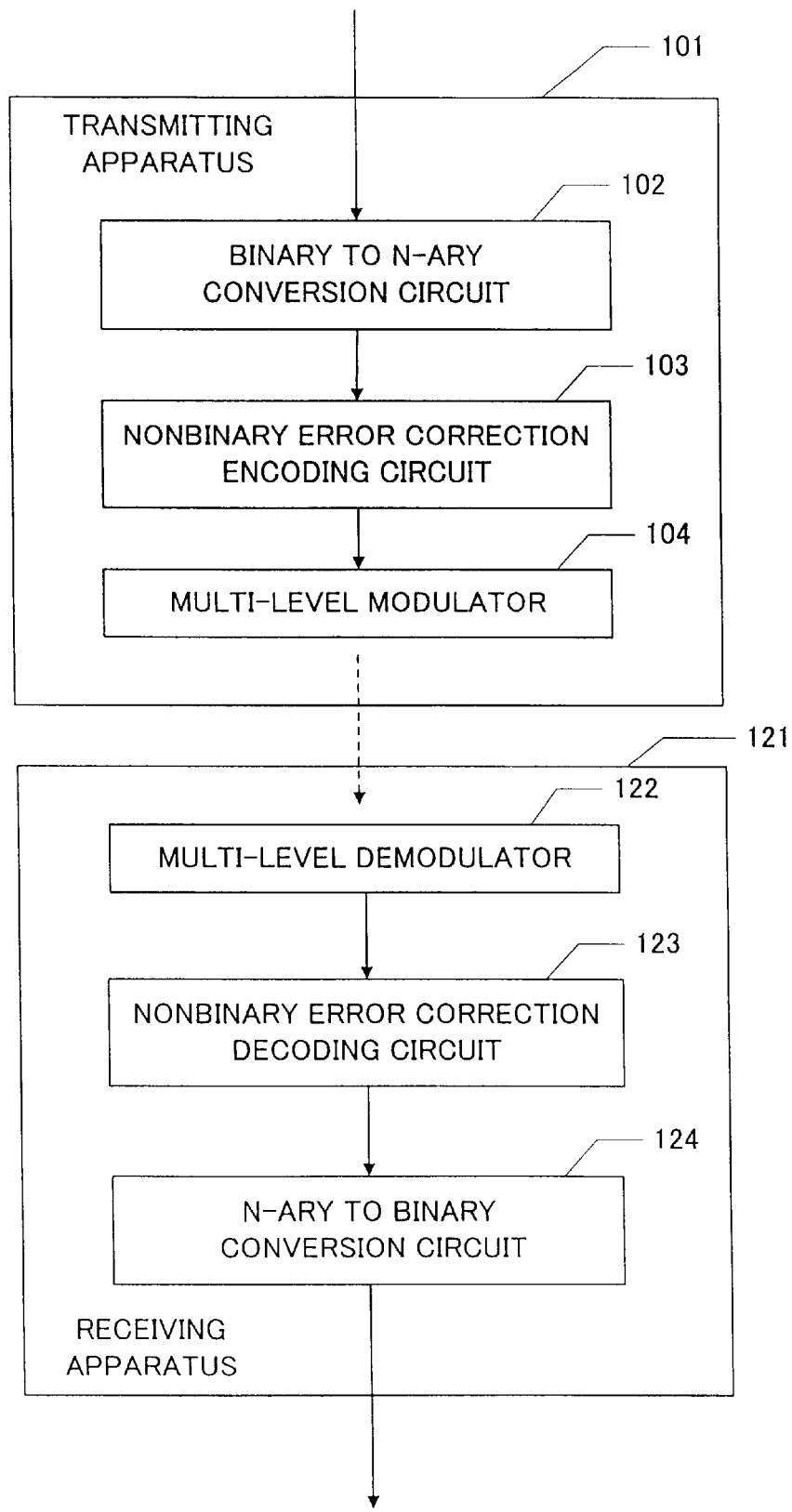
FIG. 1 is a block diagram showing the structure of a communication system employing the present invention.

Preferred embodiments of the present invention will be described with reference to the accompanying drawings. Referring to FIG. 1, the present invention provides a communication system employing a multi-level modulation system based on an N-ary number with N is a prime number exceeding 2, in which a transmitting apparatus (termed also as sending device) 101 includes a nonbinary error correction encoding circuit 103 between a binary to N-ary converter 102 for converting the binary signals into N-ary signals and a multi-level modulator 104, while a receiving apparatus 121 includes a nonbinary error correction decoding circuit 123, as a counterpart circuit of the nonbinary error correction encoding circuit 103 of the transmitting apparatus 101, between a multi-level demodulator 122 and an N-ary to binary conversion circuit 124.

In the multi-level modulator 104 and in the multi-level demodulator 122, as the N-ary number is adopted a prime number exceeding 2, such as 3, 5, 7, 11, . . . For example, if the N-ary number is 3, the multi-level modulator 104 is a three-phase modulator, with the multi-level demodulator 122 being a three-phase demodulator. If the N-ary number is 5, the multi-level modulator 104 is a five-phase modulator, with the multi-level demodulator 122 being a five-phase demodulator. The binary to N-ary converter 102 and the N-ary to binary conversion circuit 124 are conversion circuits for performing conversion between the binary signals and the aforementioned multi-level modulation number (N-ary number). The nonbinary error correction encoding circuit 103 and the nonbinary error correction decoding circuit 123 perform calculations based on the nonbinary error correction codes to realize error correction decoding.

Consequently, in the N-ary conversion system, having a prime number exceeding 2 as the N-ary number, a meritorious effect is realized that efficient error correction can be achieved in comparison with a case in which the conventional binary error correction code is used.

Referring to FIG. 1, an input signal, as a binary signal, is supplied to the binary to N-ary converter 102. The binary to N-ary converter 102 converts the binary signal into an N-ary signal as an information sequence. The N-ary signal, as an information sequence, is supplied to the nonbinary error correction encoding circuit 103. Based on the N-ary signal, as the information sequence, the nonbinary error correction encoding circuit 103 performs nonbinary error correction coding, which is based on the nonbinary error correction code, to generate a multi-level transmit sequence. This multi-level transmit sequence is sent to the multi-level modulator 104. The multi-level modulator 104 performs multi-level modulation on the multi-level transmit sequence to transmit the modulated signal over a transmission line to the receiving apparatus 121.

In the receiving apparatus 121, the multi-level demodulator 122 demodulates signals received over a transmission line from the transmitting apparatus 101 to output a multi-leveled received sequence. The multi-leveled received sequence is supplied to the nonbinary error correction decoding circuit 123. The nonbinary error correction decoding circuit 123 is a counterpart circuit of the nonbinary error correction encoding circuit 103 and corrects the multi-leveled received sequence to generate a multi-leveled decoded sequence. This multi-leveled decoded sequence is supplied to the N-ary to binary conversion circuit 124. The N-ary to binary conversion circuit 124 converts the input multi-leveled decoded sequence into binary received signals to output the resulting signals.

The nonbinary error correction code is now explained. First, the code parameters of the ternary BCH (Bose-Chaudhuri-Hocquenghem) code as typical of the nonbinary error correction code, are explained with reference to FIG. 2. The ternary BCH code is formed on the basis of the following p-degree generator polynomial p(x) having three coefficients of 0, 1 and 2:

$$p(x)=x^p-a_{p-1}x^{p-1}+ \ldots +a_1x+a_0 \qquad (1)$$

where $a_i=0,1,2$

The code length is $(3^p-1)/2$ in case of performing bidirectional correction of plus 1 and minus 1 (corresponding to 2 in the Galois field GF (3)). In general, if the code length is n, the information length k is k=n−t·p and redundancy is (n−k)/n in case of t-fold error correction, In case of one-fold error correction code, the generating polynomial is the following generating polynomial with the number of degrees being three:

$$p(x)=x^3+2x+1 \qquad (2).$$

If the bidirectional error correction is considered, the code length is 13 and the information length is 10. A check matrix H is given by:

$$H = \begin{bmatrix} 1 & 0 & 0 & 2 & 0 & 2 & 1 & 2 & 2 & 1 & 0 & 2 & 2 \\ 0 & 1 & 0 & 1 & 2 & 1 & 1 & 2 & 0 & 1 & 1 & 1 & 0 \\ 0 & 0 & 1 & 0 & 1 & 2 & 1 & 1 & 2 & 0 & 1 & 1 & 1 \end{bmatrix}. \qquad (3)$$

Meanwhile, the error correction codes, such as nonbinary BCH codes or Reed-Solomon codes, are discussed in great detail in Arnold M. Michelson, Allen H. Levesque, "Error Control Techniques for Digital Communication", John Wiley & Sons, 1985, Chapter 6 "Nonbinary BCH Codes and Reed-Solomon Codes". The parameters of the nonbinary BCH codes are indicated in Yo Miyagawa, Yoshihiro Iwatare and Hideki Imai, "Code Theory", Shokoodo Press, 1973, Appendix 2 "Table of Irreducible Polynominals on G(p), where p is a prime number".

A first specified way of constructing the binary to N-ary converter 102 is adopting a circuit for converting the binary n digits into an N-ary p digits. For example, for N=3 and N=5, the combination of (n, p) is (3, 2), (11, 7), (19, 12), . . . and (9, 4), (16, 7) and (23, 10), respectively.

Figure 2:
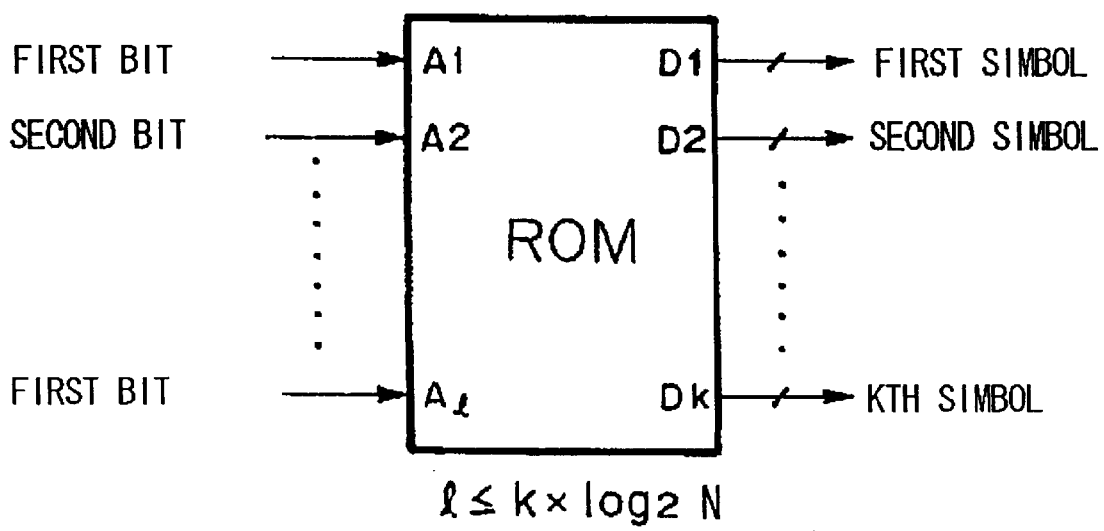
FIG. 2 is a block diagram showing an illustrative structure of a binary to N-ary conversion circuit of the embodiment shown in FIG. 1.

A specified second way of constructing the binary to N-ary converter 102 is now explained. Assuming that the number of elements of the nonbinary error correction code, which is generated in the nonbinary error correction circuit, is N, and the information length is k, the value that can be taken by the information sequence is $N^k$. This value may be represented as binary $2^l$. Thus, the binary to N-ary converter 102 may be implemented with the use of a ROM which receives as an address input a binary signal of a number of bits l of the maximum possible value satisfying $l \leq k \times \log_2 N$ and outputting an information sequence as a nonbinary symbol sequence associated with each address. FIG. 2 shows input/output signals of the ROM.

Figure 3:
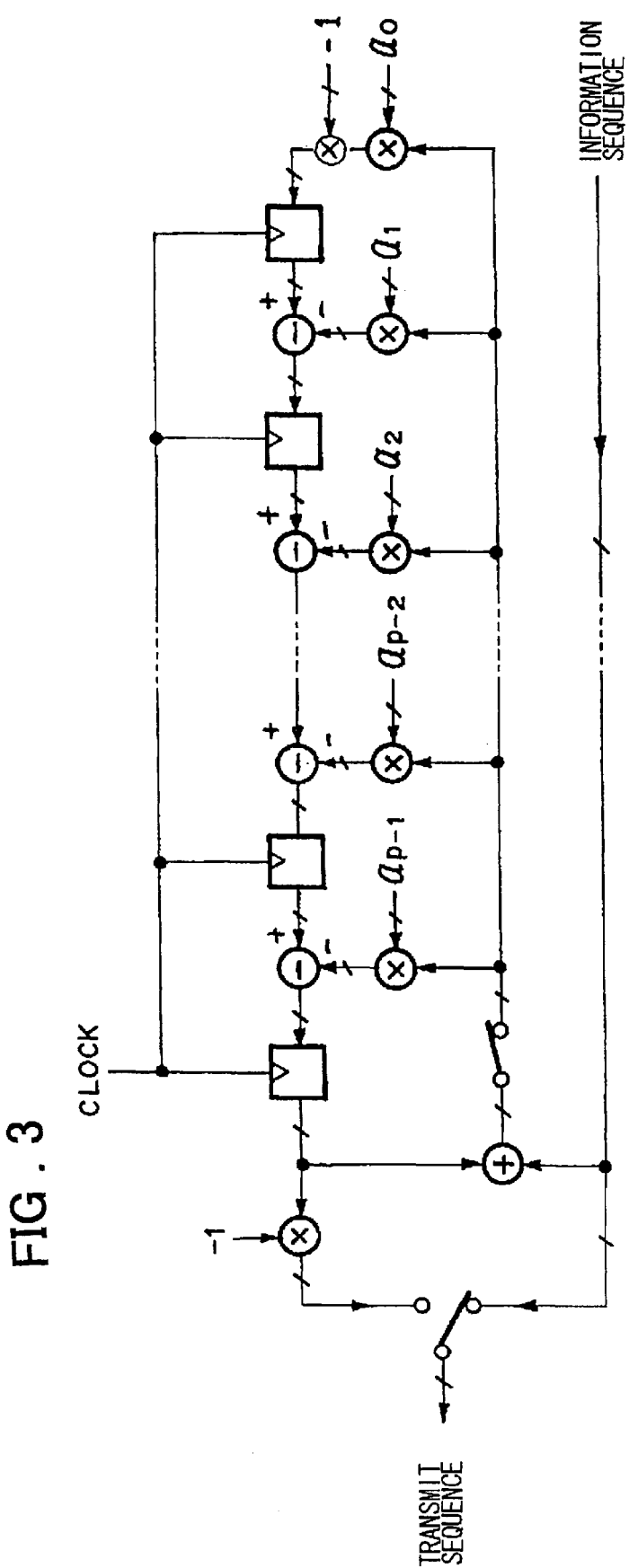
FIG. 3 is a block diagram showing an illustrative structure of a nonbinary error correction encoding circuit of FIG. 1 employing the present invention.

A specified structure of the nonbinary error correction encoding circuit 103 is now explained. The nonbinary error correction encoding circuit 103 is of a well-known structure shown in FIG. 3, in which adders (+) and multipliers (×) respectively perform addition and multiplication on a Galois field GF(q), where q denotes the number of elements of the Galois field.

Figure 4:
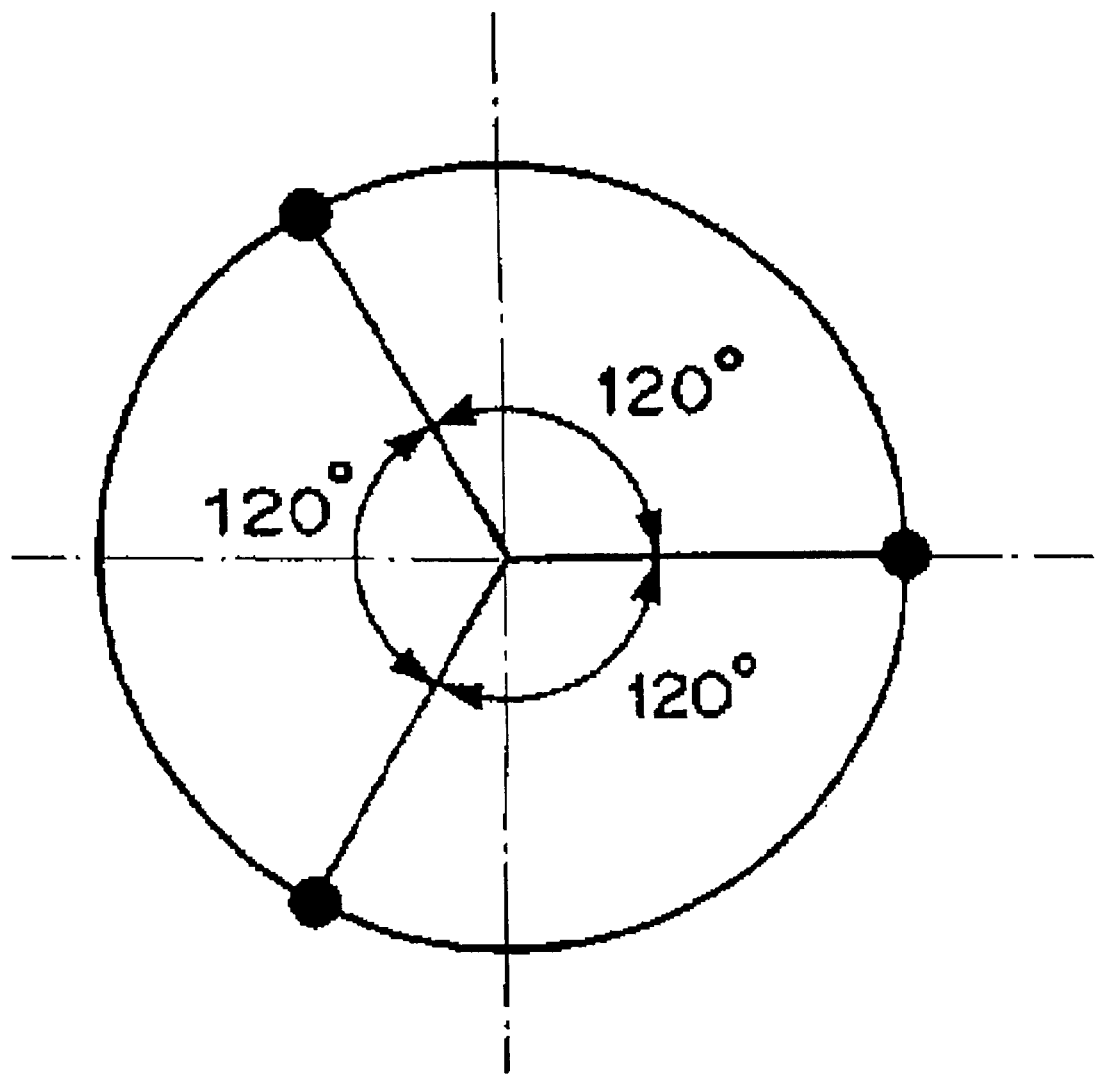
FIG. 4 is a phase plane diagram showing mapping from a symbol value to an information point on the phase plane in the case of a ternary modulation.
Figure 5:
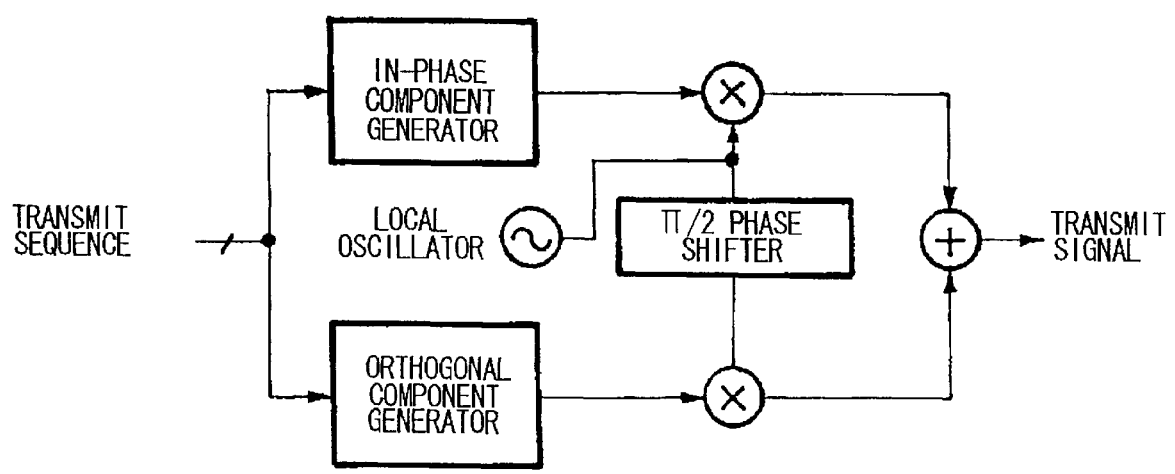
FIG. 5 is a block diagram showing an illustrative structure of a multi-level modulator of FIG. 1 employing the present invention.

A specified structure of the multi-level modulator 104 is now explained. It is sufficient for the multi-level modulator 104 to perform mapping from a symbol value to an information point on a phase plane. An instance of mapping for the value of N equal to three is shown in FIG. 4. The multi-level modulator 104 is of an exemplary structure shown in FIG. 5. As shown in FIG. 5, there are provided in-phase and orthogonal phase component generators, a local oscillator, a pi/2-phase shifter, two mixers (multipliers) and an adder for outputting a transmit signal. For values of N equal to 5, 7, 11 or the like, it is sufficient to effect mapping each symbol value to each of respective points obtained on angular division of the phase plane by N, as for the value of N equal to 3.

Figure 6:
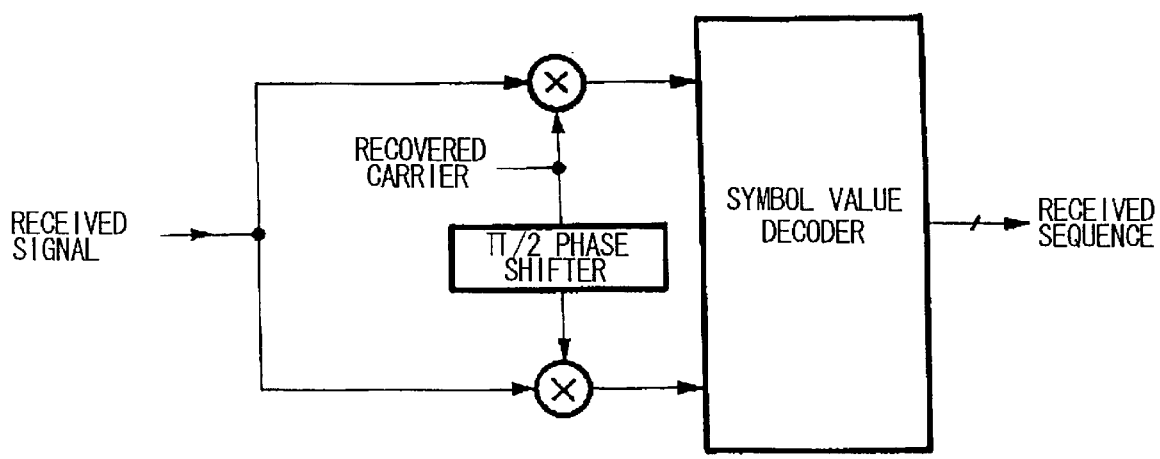
FIG. 6 is a block diagram showing an illustrative structure of a multi-level demodulator of FIG. 1 employing the present invention.

A specified structure of the multi-level demodulator 122 is now explained. It is sufficient for the multi-level demodulator 122 to effect mapping from the information point on the phase plane to the symbol value. Thus, the multi-level demodulator 122 is of an exemplary structure shown in FIG. 6. As shown in FIG. 6, there are provided a pi/2-phase shifter for phase-sifting a recovered carrier, two mixers (multipliers) and a symbol value decoder.

A specified structure of the nonbinary error correction decoding circuit 123 is now explained. The nonbinary error correction decoding circuit 123 is of an exemplary structure shown in FIG. 7.

Figure 7:
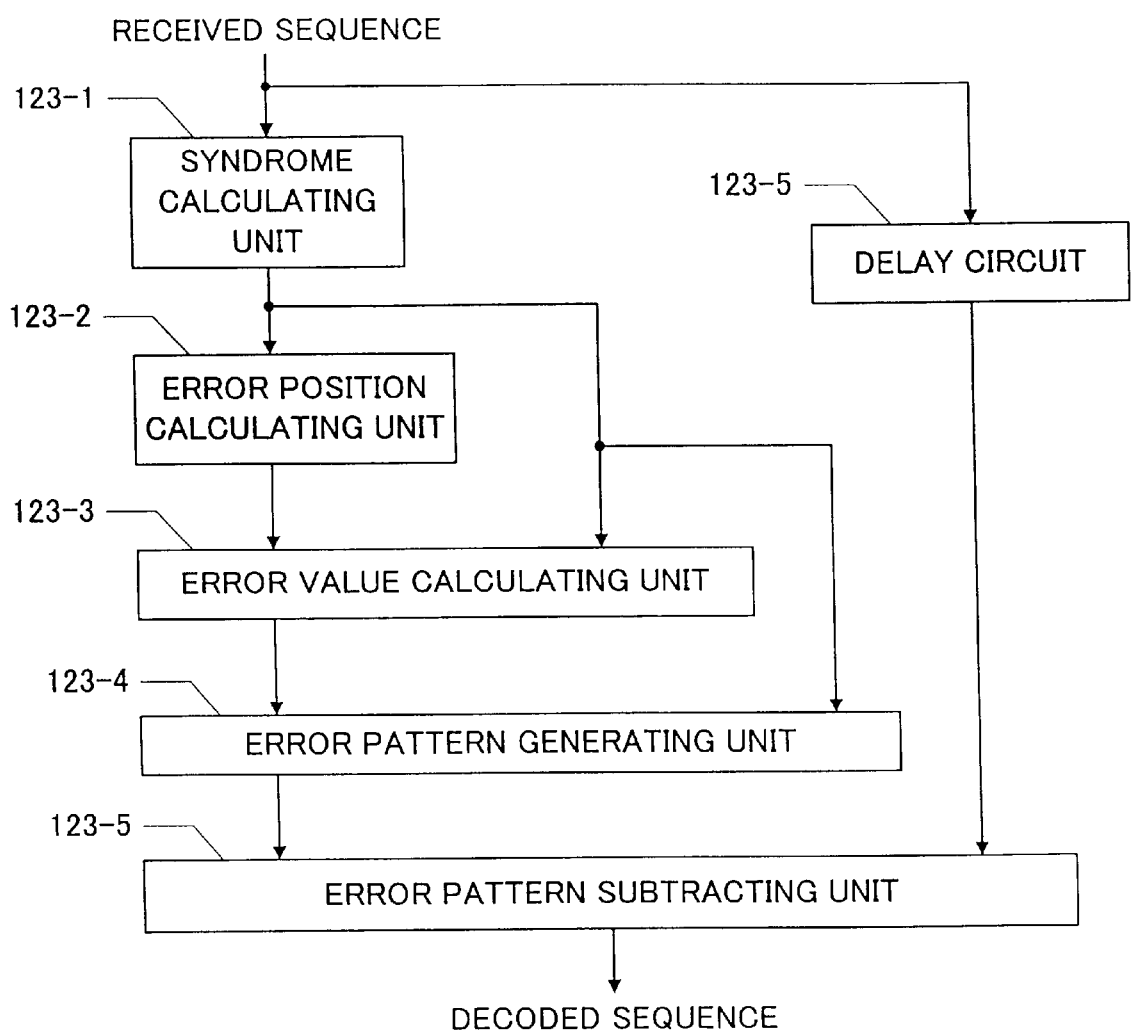
FIG. 7 is a block diagram showing an illustrative structure of a nonbinary error correction decoding circuit of FIG. 1 employing the present invention.

Referring to FIG. 7, the nonbinary error correction decoding circuit 123 includes a syndrome calculating unit 123-1, an error position calculating unit 123-2, an error value calculating unit 123-3, an error pattern generating unit 123-4, a delay circuit 123-5 and an error pattern subtracting unit 123-6.

The syndrome calculating unit 123-1 calculates a syndrome based on a received sequence. The error position calculating unit 123-2 generates an error position locator polynomial, based on the syndrome, and solves the error position locator polynomial to calculate the error position. The error value calculating unit 123-3 receives the syndrome and the error position and calculates the error value from the error evaluator polynomial and a derivative of the error position polynomial. The error pattern generating unit 123-4 generates an error pattern from the error position and the error value. The delay circuit 123-5 delays the received signal sequence a preset time. The error pattern subtracting unit 123-6 subtracts an error pattern from the delayed received signal sequence to output a decoded sequence.

Figure 8:
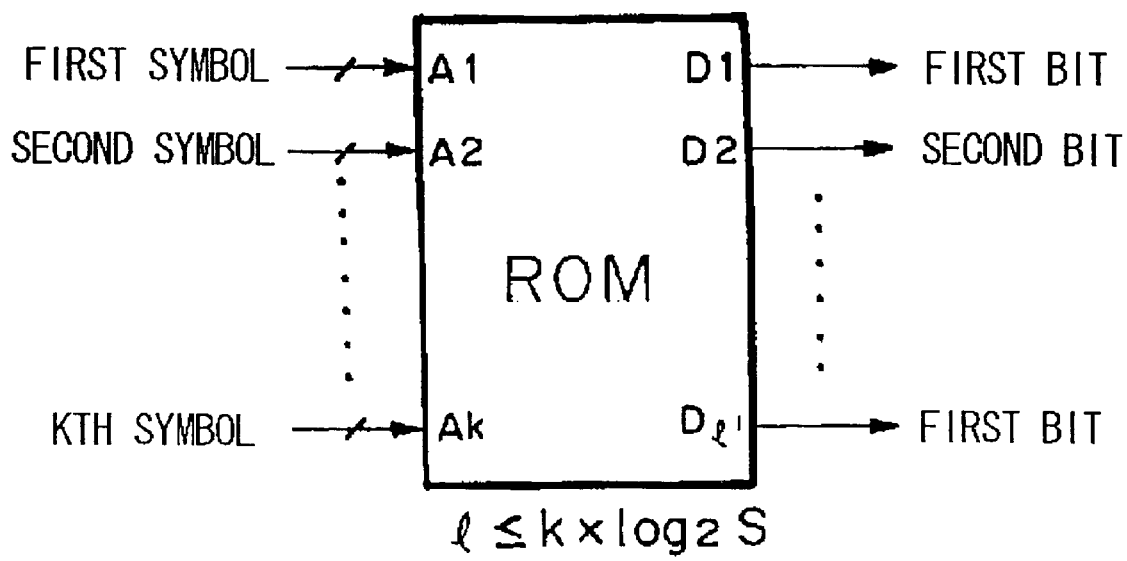
FIG. 8 is a block diagram showing an illustrative structure of an N-ary to binary conversion circuit of the embodiment shown in FIG. 1.

A specified structure of the N-ary to binary conversion circuit 124 is explained. If the number of elements of the nonbinary error correction code, generated by the nonbinary error correction coding circuit, is N, and the information length is k, the value that can be taken by the information sequence is $N^k$. This number may be represented in binary as $2^l$. Thus, the N-ary to binary conversion circuit 124 may be implemented with the use of a ROM, supplied with a decoded sequence, as a symbol sequence comprised of k elements, as an input, and outputting a binary signal of $l = k \times \log_2 N$ bits, as data. FIG. 8 shows input and output signals for the ROM.

Figure 9A:
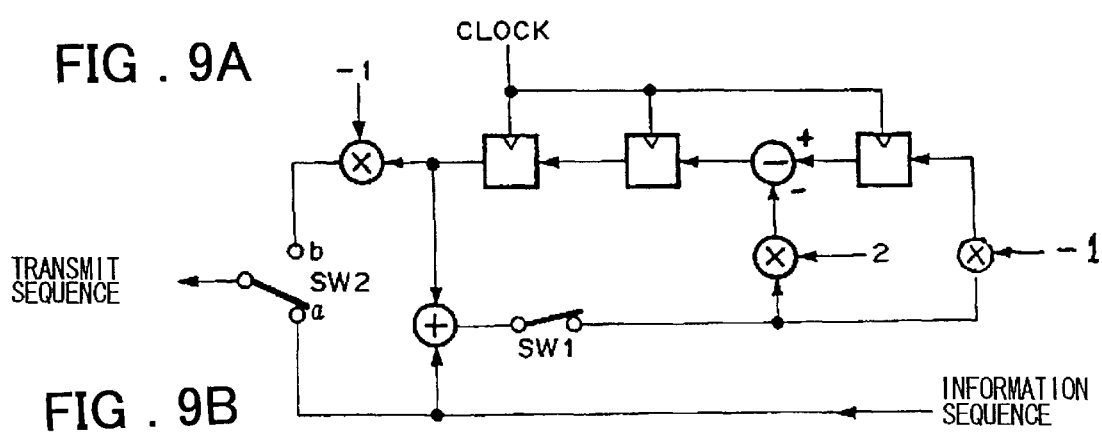
FIGS. 9A to 9B are block diagrams showing an illustrative structure of a nonbinary error correction encoding circuit of FIG. 1 employing the present invention.
Figure 9B:
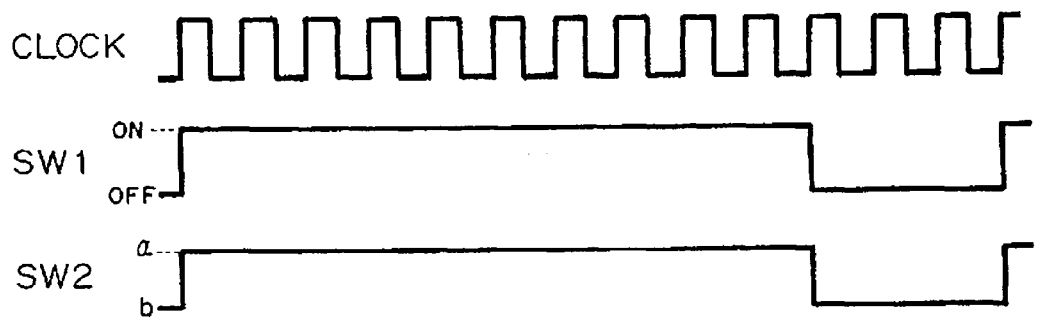

The nonbinary error correction encoding circuit 103, employing the equation (2) as the generator polynomial, is as shown in FIG. 9. In the circuit of FIG. 9a, the adders (+) and multipliers (×) perform the operations shown in the following Table. On the other hand, the circuit of FIG. 9a operates with a timing shown in FIG. 9b.

TABLE 1

| Addition | | | |
|---|---|---|---|
| | 0 | 1 | 2 |
| 0 | 0 | 1 | 2 |
| 1 | 1 | 2 | 0 |
| 2 | 2 | 0 | 1 |
| Multiplication | | | |
| | 0 | 1 | 2 |
| 0 | 0 | 0 | 0 |
| 1 | 0 | 1 | 2 |
| 2 | 0 | 2 | 1 |

In the case of a ternary BCH code, with the code length=13 and the information length=10, the nonbinary error correction decoding circuit 123 can be constructed using a check matrix shown in the equation (3). FIG. 10 shows a structure of the ternary error correction decoding circuit 123 in this case.

Referring to FIG. 10, the ternary error correction decoding circuit 123 includes a matrix calculating unit 123-11, an error pattern generating unit 123-12 and an error pattern subtraction unit 123-13.

Assuming that the received sequence is a vector y={y1, y2, ..., y13}, the matrix calculating unit 123-11 finds the syndrome s={s1, s2, s3} by the operation of $s=yH^T$.

From the following table, the error pattern generating unit 123-12 finds a set of (error location and error value) from the syndrome value. Thus, the error pattern generating unit 123-12 can be constructed by a ROM designed to perform mapping shown in the following Table:

TABLE 2

| Syndrome Values | | | Error Location and Error Value |
|---|---|---|---|
| 1 | 0 | 0 | (1, 1) |
| 2 | 0 | 0 | (1, 2) |
| 0 | 1 | 0 | (2, 1) |
| 0 | 2 | 0 | (2, 2) |
| 0 | 0 | 1 | (3, 1) |
| 0 | 0 | 2 | (3, 2) |
| 2 | 1 | 0 | (4, 1) |
| 1 | 2 | 0 | (4, 2) |
| 0 | 2 | 1 | (5, 1) |
| 0 | 1 | 2 | (5, 2) |
| 2 | 1 | 2 | (6, 1) |
| 1 | 2 | 1 | (6, 2) |
| 1 | 1 | 1 | (7, 1) |
| 2 | 2 | 2 | (7, 2) |
| 2 | 2 | 1 | (8, 1) |
| 1 | 1 | 2 | (8, 2) |
| 2 | 0 | 2 | (9, 1) |
| 1 | 0 | 1 | (9, 2) |
| 1 | 1 | 0 | (10, 1) |
| 2 | 2 | 0 | (10, 2) |
| 0 | 1 | 1 | (11, 1) |
| 0 | 2 | 2 | (11, 2) |
| 2 | 1 | 1 | (12, 1) |
| 1 | 2 | 2 | (12, 2) |
| 2 | 0 | 1 | (13, 1) |
| 1 | 0 | 2 | (13, 2) |

The meritorious effects of the present invention are summarized as follows.

The present invention discloses a method for constructing an error correction system in a modulation system having a prime number as an N-ary number, such as three-phase or five-phase modulation. In the prior art, two-phase, four-phase or eight-phase modulation has been adopted for practical use. In such prior-art modulation, C/N values of 10.5 dB, 13.8 dB and 19.1 dB are required for realizing an error rate of $10^{-6}$ and relative bands of 100 MHz, 50 MHz and 33.3 MHz are required for realizing an error rate of $10^{-6}$. In general, in three-phase and five-phase modulation, the C/N ratio required is 12.0 dB and 15.4 dB, respectively, while the band required is 66.6 MHz and 44.4 MHz, respectively. If, for example, a band of 70 MHz is provided, four-phase modulation has hitherto been utilized with the required C/N ratio of 13.8 dB, since the band is surpassed with the two-phase modulation. If the technique of the present invention, which is presupposed in the case of the present application, is used, three-phase modulation can be utilized with the required C/N of 12.0 dB, thus saving the transmission power by 1.8 dB. On the other hand, if the band of 45 MHz is provided, the band is surpassed with the four-phase modulation, and hence the eight-phase modulation has been utilized, with the required C/N ratio being 19.1 dB. However, in this case, the five-phase modulation, presupposed in the case of the present application, may be used. This five-phase modulation may be realized with the required C/N of 15.4 dB, with a saving of 3.7 dB of the transmission power. Additionally, with the use of the error correction system of the present application, the required C/N ratio may be expected to be improved by 2 to 3 dB.

Figure 11:
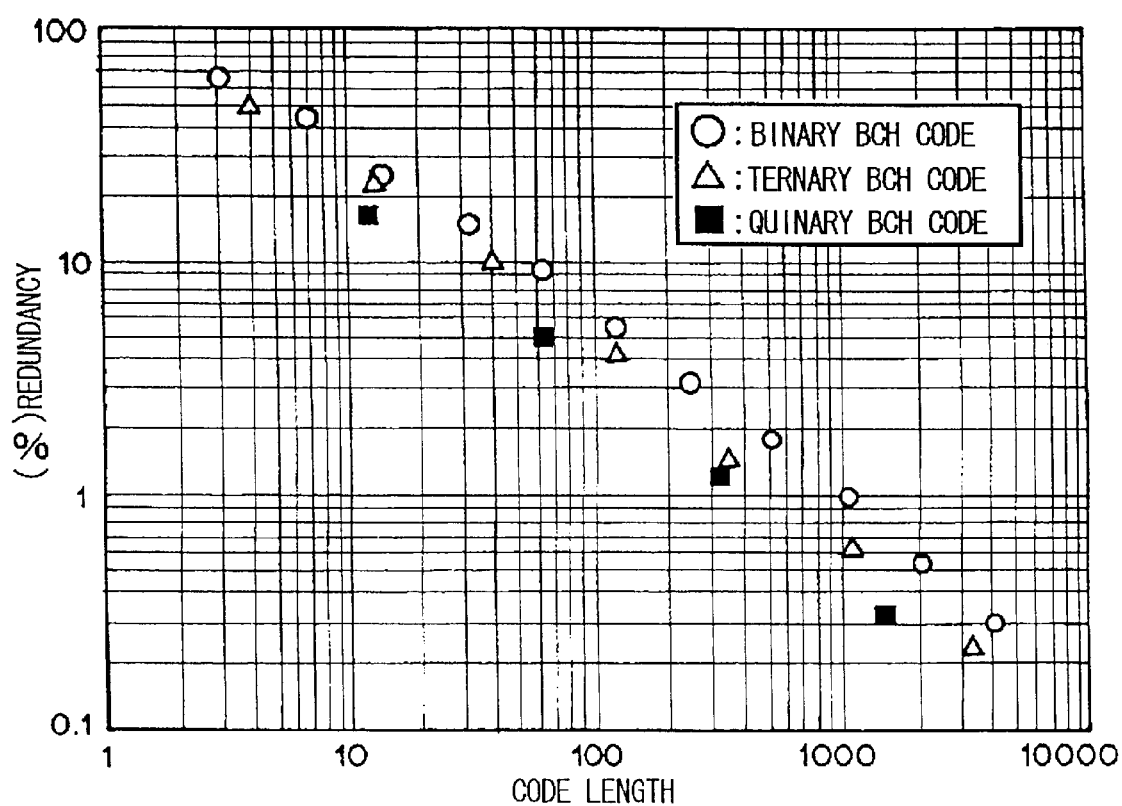
FIG. 11 is a graph for illustrating the meritorious effect of the present invention and specifically showing the relation between the code length and redundancy in each BCD code.
Figure 12:
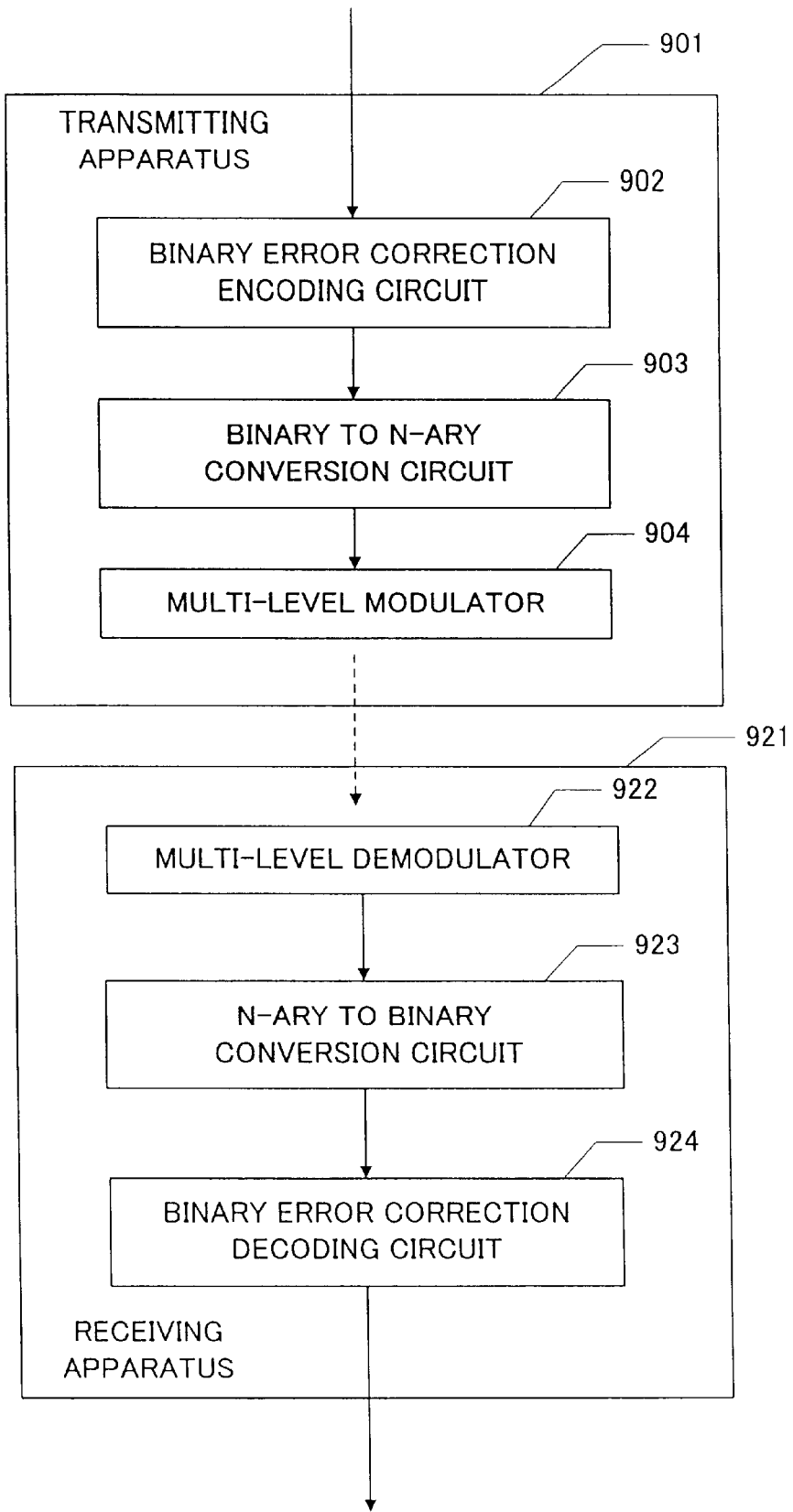
FIG. 12 is a block diagram showing the structure of a communication system in a related art.

According to the present invention, in which, with the modulation system having a prime number as an N-ary number, nonbinary error correction code is used, such an effect which has not been achieved in case of not using the nonbinary error correction code may be produced. That is, referring to the graph of FIG. 11 in which the code length of the binary, ternary and quinary BHC code is plotted against redundancy, it may be seen that the code length is shorter in the case of the multi-dimensional code for the approximately equivalent redundancy. The fact that the code length is shorter for the approximately equivalent redundancy indicates that the multi-ary code is superior in the correction capability for the equivalent redundancy. In general, if, in single error correction, an symbol error rate is p, and an error rate is sufficiently smaller than the reciprocal of the code length, the symbol error rate following error correction is approximately $(3/2)\times(n-1)\times p^2$, indicating that the error rate is better the shorter the code length.

In the above-described embodiments, ternary and quinary BCH codes have been explained as the nonbinary code. Alternatively, error correction systems may be constructed using a prime number other than 3 or 5 as element.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A communication system including a transmitting apparatus and a receiving apparatus for sending/receiving signals over a transmission line, wherein said transmitting apparatus comprises:

binary to N-ary converting means for converting a binary transmit signal into an N-ary signal, as an information sequence, the N-ary number being a prime number exceeding 2;

encoding means for generating a transmit sequence which includes a nonbinary error correction code, based on the N-ary signal as said information sequence; and multi-level modulating means for performing multi-level modulation of said transmit sequence to send the modulated transmit seuence to said receiving apparatus; and wherein said receiving apparatus comprises:

demodulating means for demodulating a received signal from said transmitting apparatus to produce a multi-leveled received sequence, the multi-level being a prime number exceeding 2;

decoding means for decoding said multi-leveled received sequence by using a nonbinary error correction code decoding method to produce an N-ary signal as a decoded sequence, the N-ary number being a prime number exceeding 2; and N-ary to binary conversion means for producing a decoded binary signal from the N-ary signal as said decoded sequence.

2. A transmitting apparatus for sending a signal over a transmission line to a receiving apparatus, comprising:

binary to N-ary converting means for converting a binary transmit signal into an N-ary signal, as an information sequence, the N-ary number being a prime number exceeding 2;

encoding means for generating a transmit sequence which includes a nonbinary error correction code, based on the N-ary signal as said information sequence; and multi-level modulation means for performing multi-level modulation of said transmit sequence to send the resulting modulated transmit sequence to said receiving apparatus.

3. A receiving apparatus for receiving a signal from a transmitting apparatus over a transmission line, comprising:

demodulating means for demodulating a received signal from said transmitting apparatus and for producing a multi-leveled received sequence, the multi-level being a prime number exceeding 2;

decoding means for decoding said received sequence by using a nonbinary error correction code decoding method to produce an N-ary signal, with the N-ary number being a prime number exceeding 2; and N-ary to binary converting means for producing a decoded binary signal from the N-ary signal as said decoded sequence.

4. A communication method for sending/receiving signals over a transmission line, comprising the steps of:

converting, by a transmitting apparatus, a binary transmit signal into an N-ary signal, as an information sequence, with the N-ary number being a prime number exceeding 2;

generating, by the transmitting apparatus, a transmit sequence which comprises a nonbinary error correction code, based on the N-ary signal as said information sequence; and performing, by the transmitting apparatus, multi-level modulation of said transmit sequence to send the modulated transmit sequence to a receiving apparatus;

demodulating, by the receiving apparatus, a received signal from said transmitting apparatus to produce a multi-leveled received sequence, the multi-value being a prime number exceeding 2;

decoding, by the receiving apparatus, said received sequence by using a nonbinary error correction code decoding method to produce an N-ary signal as a decoded sequence, the N-ary number being a prime number exceeding 2; and producing, by the receiving apparatus, a decoded binary signal from the N-ary signal as said decoded sequence.

5. A method for sending a signal, comprising the steps of:

converting, by a transmitting apparatus, a binary transmit signal into an N-ary signal, the N-ary number being a prime number exceeding 2, as a transmit sequence;

generating, by the transmitting apparatus, a transmit sequence which includes a nonbinary error correction code, based on the N-ary signal as said information sequence; and performing, by the transmitting apparatus, multi-level modulation of said transmit sequence to send the resulting modulated transmit sequence to said receiving apparatus.

6. A method for receiving a signal, comprising the steps of:

demodulating, by a receiving apparatus, a received signal to produce a multi-leveled received sequence, the multi-level being a prime number exceeding 2;

decoding, by the receiving apparatus, said received sequence by using a nonbinary error correction code decoding method to produce an N-ary signal, the N-ary number being a prime number exceeding 2; and producing, by the receiving apparatus, a decoded binary signal from the N-ary signal as said decoded sequence.

* * * * *